(12) United States Patent
Breninger et al.

(10) Patent No.: US 12,500,114 B2
(45) Date of Patent: Dec. 16, 2025

(54) WAFER LIFT PIN MECHANISM FOR PREVENTING LOCAL BACKSIDE DEPOSITION

(71) Applicant: LAM RESEARCH CORPORATION, Fremont, CA (US)

(72) Inventors: Andrew H. Breninger, Hillsboro, OR (US); Xinyi Chen, Beaverton, OR (US); Tu Hong, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 512 days.

(21) Appl. No.: 17/800,106

(22) PCT Filed: Feb. 18, 2021

(86) PCT No.: PCT/US2021/018443
§ 371 (c)(1),
(2) Date: Aug. 16, 2022

(87) PCT Pub. No.: WO2021/168025
PCT Pub. Date: Aug. 26, 2021

(65) Prior Publication Data
US 2023/0099332 A1 Mar. 30, 2023

Related U.S. Application Data

(60) Provisional application No. 62/978,914, filed on Feb. 20, 2020.

(51) Int. Cl.
*H01L 21/687* (2006.01)
*H01J 37/32* (2006.01)

(52) U.S. Cl.
CPC .. *H01L 21/68742* (2013.01); *H01J 37/32715* (2013.01)

(58) Field of Classification Search
CPC .......... H01L 21/68742; H01J 37/32733; H01J 37/32715
See application file for complete search history.

(56) References Cited

U.S. PATENT DOCUMENTS

2005/0180737 A1\* 8/2005 Kurita ................... F16C 29/045
257/E21.001
2007/0089836 A1\* 4/2007 Metzner ............ H01L 21/68735
156/914
(Continued)

FOREIGN PATENT DOCUMENTS

JP 2001024047 A 1/2001
JP 2002231794 A 8/2002
(Continued)

OTHER PUBLICATIONS

International Search Report and Written Opinion of the ISA issued in PCT/US2021/018443, mailed Jun. 10, 2021; ISA/KR, 9 pages.
(Continued)

*Primary Examiner* — Joseph A Miller, Jr.

(57) ABSTRACT

An apparatus includes a lift pinto raise and lower a semiconductor substrate relative to a substrate support assembly in a processing chamber. The lift pin includes a top end having a conical shape tapering downwardly and a bottom end having a cylindrical shape. The apparatus comprises a lift pin holder to hold the bottom end of the lift pin.

18 Claims, 14 Drawing Sheets

(56) References Cited

U.S. PATENT DOCUMENTS

| | | | |
|---|---|---|---|
| 2008/0210680 A1* | 9/2008 | Hayashi | ............ H01L 21/68742 |
| | | | 219/444.1 |
| 2017/0125280 A1 | 5/2017 | Ghosh et al. | |
| 2017/0133260 A1 | 5/2017 | Pohl et al. | |
| 2018/0090363 A1 | 3/2018 | Breninger et al. | |

FOREIGN PATENT DOCUMENTS

| | | |
|---|---|---|
| JP | 2011505691 A | 2/2011 |
| JP | 2011525717 A | 9/2011 |
| JP | 2014039972 A | 3/2014 |
| WO | WO-2011008805 A2 | 1/2011 |

OTHER PUBLICATIONS

Japanese Office Action for Japanese Application No. 2022-549848 dated Dec. 10, 2024.

* cited by examiner

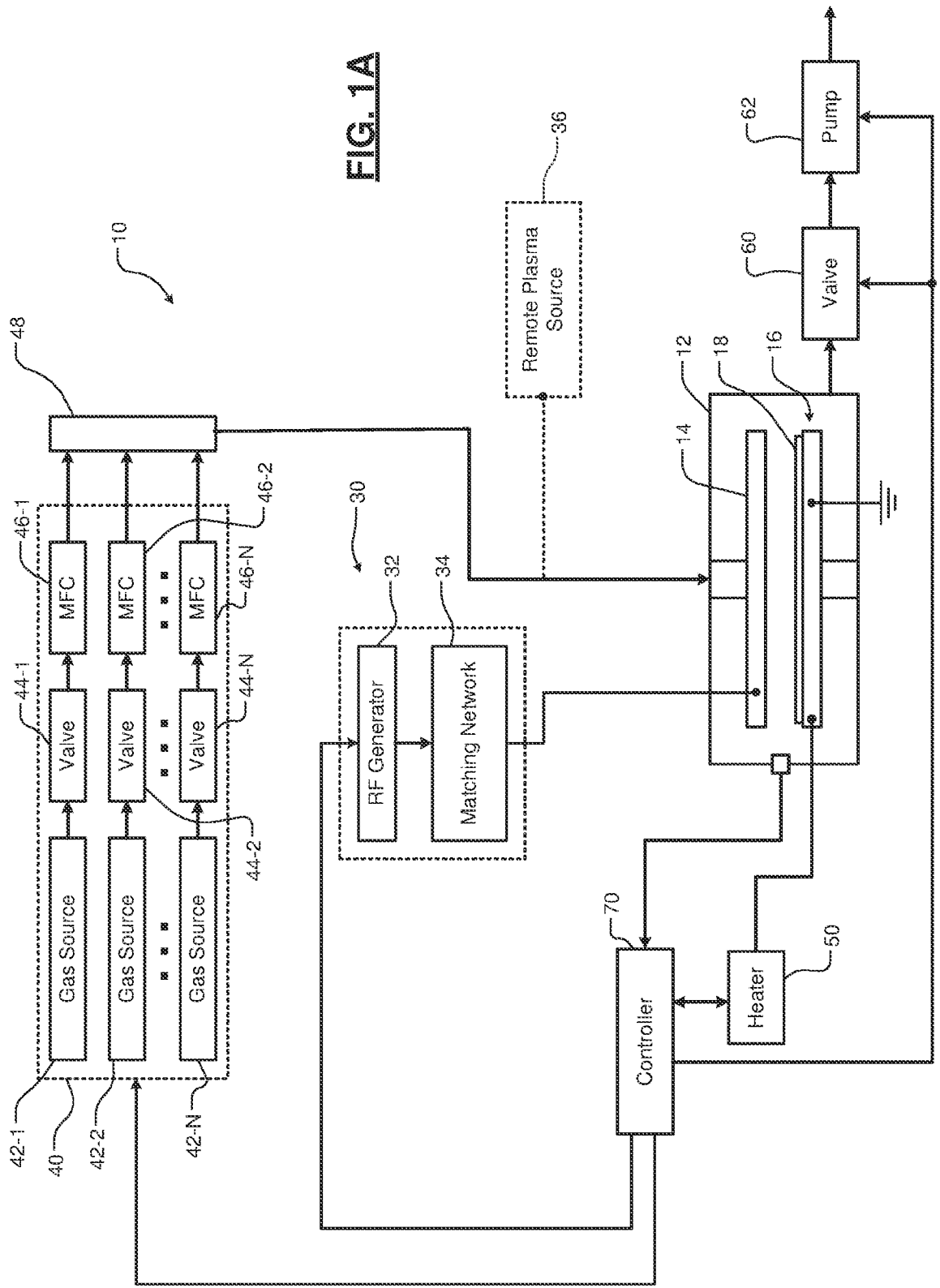

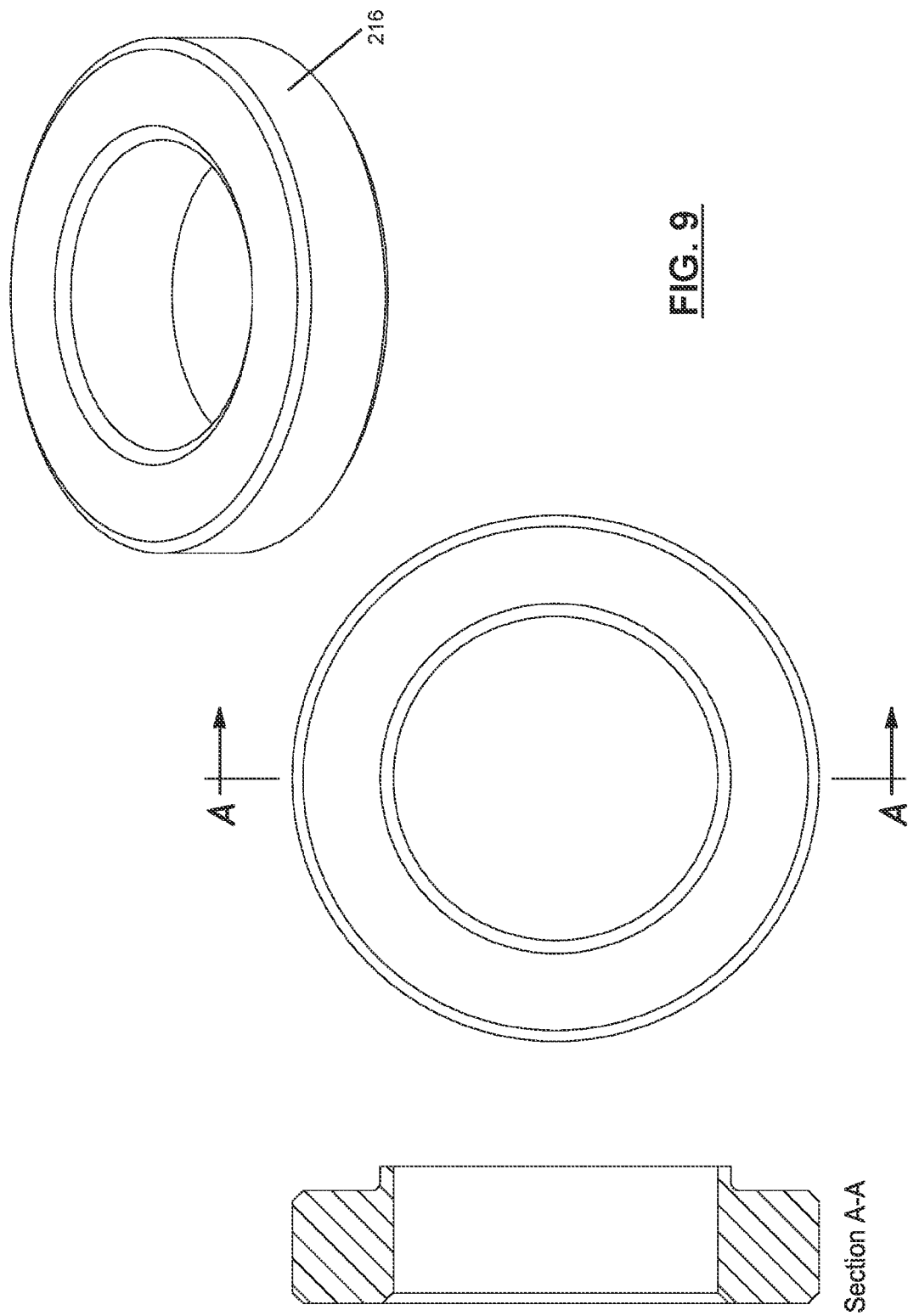

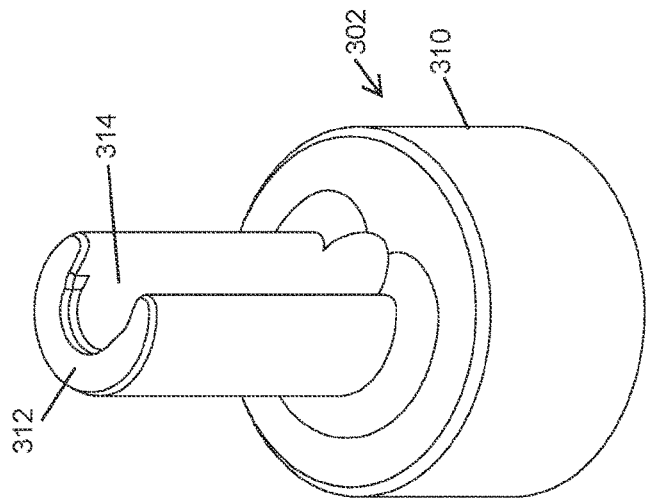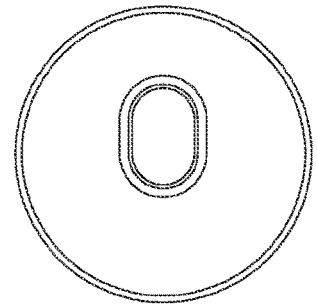
FIG. 11A

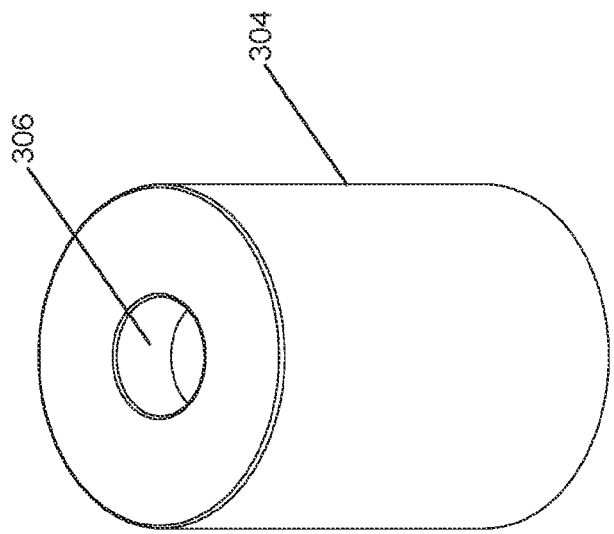
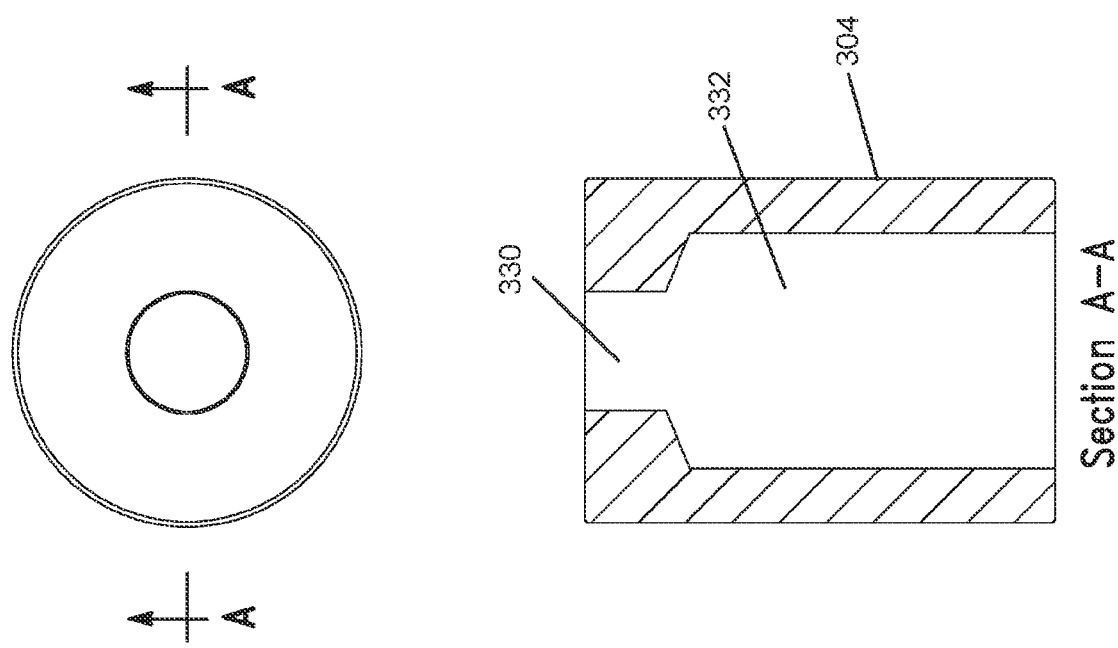
FIG. 11B

WAFER LIFT PIN MECHANISM FOR PREVENTING LOCAL BACKSIDE DEPOSITION

CROSS-REFERENCE TO RELATED APPLICATIONS

This application is a U.S. National Phase Application under 35 U.S.C. 371 of International Application No. PCT/US2021/018443, filed on Feb. 18, 2021, which claims the benefit of U.S. Provisional Application No. 62/978,914, filed on Feb. 20, 2020. The entire disclosures of the applications referenced above are incorporated herein by reference.

FIELD

The present disclosure relates generally to substrate processing systems and more particularly to a lift pin mechanism for preventing local backside deposition on semiconductor wafers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch, ash, clean or otherwise perform treatment of film on a substrate such as a semiconductor wafer. The substrate processing systems typically include a processing chamber, a gas distribution device, and a substrate support assembly. During processing, the substrate is arranged on the substrate support assembly. Different gas mixtures may be introduced into the processing chamber. Radio frequency (RF) plasma and/or heat may be used to activate chemical reactions.

Lift pins may be used to allow delivery and removal of the substrate from the processing chamber using a robot arm. Normally, an upper end of the lift pins is located flush with or below an upper surface of the substrate support assembly. A bottom portion of the lift pins is located in and retained by a lift pin holder. During substrate delivery or removal, the lift pins are raised relative to an upper surface of the substrate support assembly to lift the substrate and provide clearance between the substrate and the substrate support assembly. The clearance between the substrate and the substrate support assembly allows an end effector of the robot arm to be inserted or removed.

SUMMARY

An apparatus comprises a lift pin to raise and lower a semiconductor substrate relative to a substrate support assembly in a processing chamber. The lift pin includes a top end having a conical shape tapering downwardly and a bottom end having a cylindrical shape. The apparatus comprises a lift pin holder to hold the bottom end of the lift pin.

In other features, the apparatus further comprises a top plate of the substrate support assembly including a conical bore tapering downwardly. The top end of the lift pin suspends from the conical bore when the lift pin is in a down position. The apparatus further comprises a ring shaped structure arranged at a base of the substrate support assembly to support the lift pin holder and to raise and lower the semiconductor substrate relative to the top plate. The lift pin holder suspends above the ring shaped structure when the lift pin is in the down position.

In other features, the apparatus further comprises a shim arranged in a slot in the ring shaped structure. The lift pin holder rests on the shim when the ring shaped structure raises the lift pin to raise the semiconductor substrate from the top plate. The apparatus further comprises a retainer arranged on the shim that surrounds the lift pin holder when the lift pin holder rests on the shim.

In another feature, the substrate support assembly includes a top plate having a conical bore tapering downwardly. The lift pin suspends from the conical bore with the conical bore supporting the top end of the lift pin when the lift pin is in a down position.

In another feature, in the down position, the top end of the lift pin suspends from the conical bore at a predetermined distance from a top surface of the top plate of the substrate support assembly.

In another feature, the apparatus further comprises a ring shaped structure arranged at a base of the substrate support assembly to support the lift pin holder and to raise and lower the semiconductor substrate relative to the substrate support assembly.

In another feature, in a down position, the top end of the lift pin suspends from a conical bore in a top plate of the substrate support assembly, the conical bore in the top plate tapering downwardly; and the lift pin holder holding the bottom end of the lift pin suspends above the ring shaped structure.

In another feature, the apparatus further comprises a shim arranged in a slot in the ring shaped structure. The lift pin holder rests on the shim when the ring shaped structure raises the lift pin to raise the semiconductor substrate from the top plate.

In another feature, the apparatus further comprises an annular retainer arranged on the shim.

In another feature, the annular retainer surrounds a base portion of the lift pin holder when the lift pin holder rests on the shim.

In other features, the lift pin further includes a groove proximate to the bottom end. The lift pin holder includes a ball lock to lock into the groove.

In another feature, the lift pin, the lift pin holder, the shim, and the retainer are made of a ceramic material.

In still other features, a system comprises a plurality of lift pins to raise and lower a semiconductor substrate relative to a substrate support assembly in a processing chamber. Each of the lift pins includes a top end having a conical shape tapering downwardly and a bottom end having a cylindrical shape. The system further comprises a plurality of lift pin holders. Each of the lift pin holders is configured to hold the bottom end of a respective one of the lift pins. The system further comprises a top plate of the substrate support assembly including a plurality of conical bores tapering downwardly. The top ends of the lift pins suspend from the conical bores when the lift pins are in a down position. The system further comprises a ring shaped structure arranged at a base of the substrate support assembly to support the lift pin holders and to raise and lower the semiconductor substrate relative to the top plate. The lift pin holders suspend above the ring shaped structure when the lift pins are in the down position.

In another feature, the system further comprises a plurality of shims respectively arranged in a plurality of slots in the ring shaped structure. The lift pin holders rest on respective of the shims when the ring shaped structure raises the lift pins to raise the semiconductor substrate from the top plate. The raised semiconductor substrate is parallel to the top plate.

In another feature, the system further comprises a plurality of retainers arranged on respective ones of the shims. The retainers surround respective ones of the lift pin holders when the lift pin holders rest on the shims.

In still other features, a lift pin comprises a first conical portion, a second portion extending from the first conical portion, and a third cylindrical portion including a groove. The third cylindrical portion extends from the second portion and is inserted into a holder including a ball lock that locks into the groove.

In still other features, a lift pin assembly comprises a lift pin to raise and lower a semiconductor substrate relative to a substrate support assembly in a processing chamber and a lift pin holder to hold the bottom end of the lift pin. The lift pin comprises a top end having a conical shape tapering downwardly and a bottom end having a cylindrical shape. The lift pin comprises a groove proximate to the bottom end. The lift pin holder comprises a ball lock to lock into the groove.

In still other features, a system comprises the lift pin assembly and the substrate support assembly. The substrate support assembly comprises a top plate having a conical bore tapering downwardly. The lift pin suspends from the conical bore at a predetermined distance from a top surface of the top plate with the conical bore supporting the top end of the lift pin when the lift pin is in a down position.

In still other features, a system comprises the lift pin assembly and a top plate of the substrate support assembly. The top plate of the substrate support assembly comprises a conical bore tapering downwardly. The top end of the lift pin suspends from the conical bore when the lift pin is in a down position. The system further comprises a ring shaped structure arranged at a base of the substrate support assembly to support the lift pin holder and to raise and lower the semiconductor substrate relative to the top plate. The lift pin holder suspends above the ring shaped structure when the lift pin is in the down position.

In still other features, the system further comprises a shim and a retainer. The shim is arranged in a slot in the ring shaped structure. The lift pin holder rests on the shim when the ring shaped structure raises the lift pin to raise the semiconductor substrate from the top plate. The retainer is arranged on the shim that surrounds the lift pin holder when the lift pin holder rests on the shim.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A and 1B show examples of substrate processing systems;

FIG. 9 shows the shim retainer in further detail;

FIGS. 11A and 11B show a fork lock type lift pin holder assembly for use with the substrate support assembly of FIG. 2.

In the drawings, reference numbers may be reused to identify similar and/or identical elements.

DETAILED DESCRIPTION

Figure 1B:
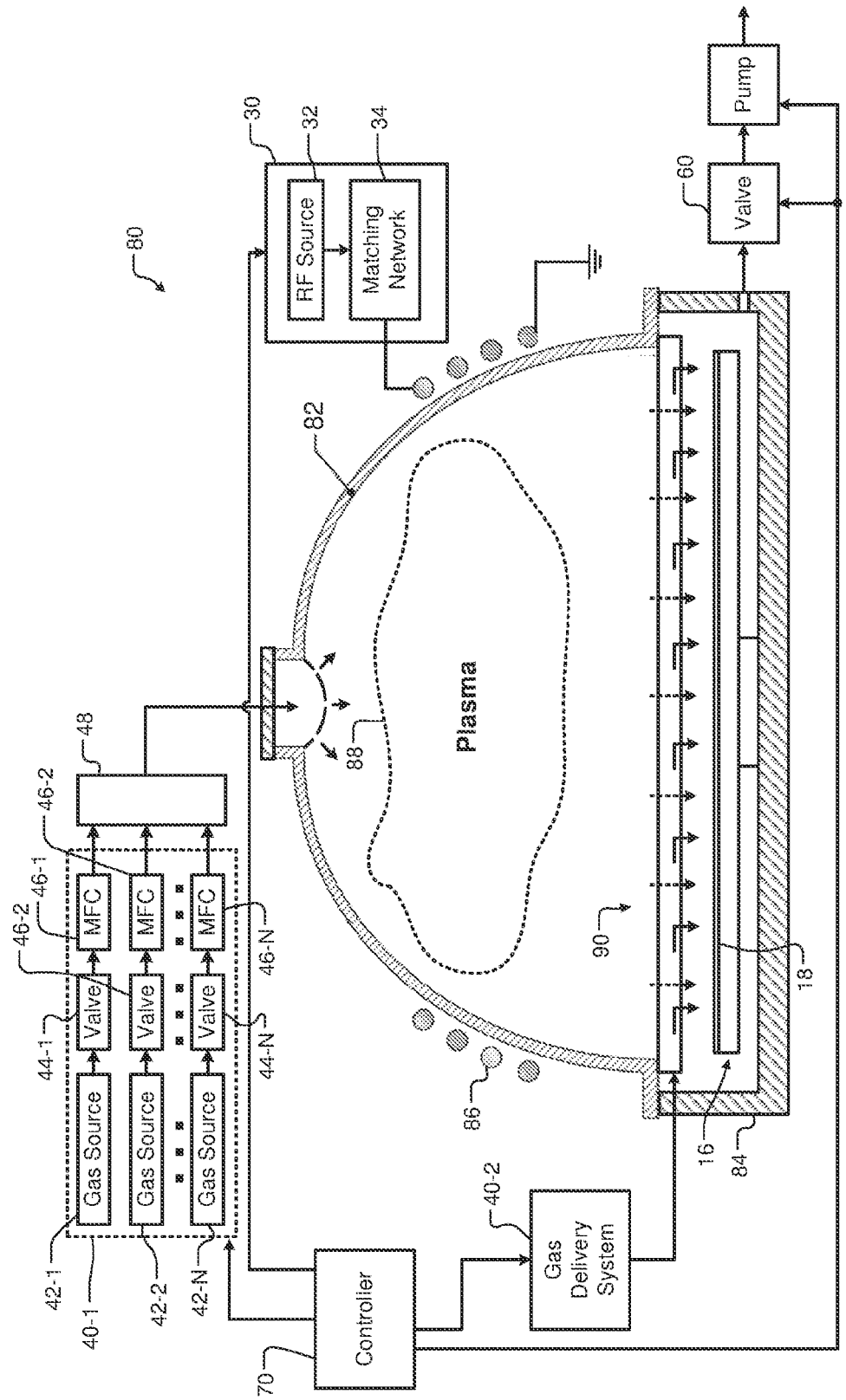

The present disclosure provides a novel design for a wafer lift pin that prevents deposition on backside of a wafer at locations proximate to lift pin holes in an ESC pedestal. The lift pin design prevents deposition on the backside of the wafer by preventing flow of process gases locally to the wafer backside and also by reducing variability in lift pin gap to the wafer.

Typically, lift pins pass through a circular hole or bore in the pedestal where the lift pins can contact and lift the wafer. The hole that the lift pin passes through has clearance to the lift pin. The lift pin is cylindrical and allows process gases to reach the wafer backside. Also, when the lift pin is in down position, the height of the lift pin is relative to a movable ring that is several inches away. Accordingly, the height of the lift pin relative to the wafer is dependent upon many factors such as the height of the movable ring and thermal expansion of the lift pin and pedestal assembly.

The lift pin design of the present disclosure solves the problem of backside deposition by both closing off the flow of process gas to the wafer backside and by increasing the repeatability of the height of the lift pin relative to the pedestal and the wafer. Specifically, the lift pin has a tapered tip which engages with a matching tapered feature in the lift pin hole of the pedestal. This engaged taper closes off the lift pin hole to process gas flow. This taper also defines the height of the lift pin relative to the pedestal surface by using the tapered pedestal hole for setting the lift pin height when the lift pin is in down position. Specifically, the tapered tip of the lift pin hangs from the tapered pedestal hole while the lift pin is in down position, and the lift pin does not contact the lift ring that moves the lift pin to the up position. This removes the variability in lift pin height caused by factors such as actuator position, manufacturing tolerances, and thermal expansion of various components.

The lift pin of the present disclosure is forced down to the pedestal by attaching a ceramic weight (e.g., a ceramic lift pin holder) assembly to the bottom of the lift pin. This weight assembly is made fully of ceramic materials to prevent corrosion and thus prevent wafer placement and defect issues. The ceramic weight assembly is easily removable from the bottom of the lift pin with a one-handed operation. This maintains the ability of the lift pin to be removed from the top side of the pedestal for easy disassembly and servicing. For example, the ceramic weight assembly can include a ball lock lift pin holder or a fork lock lift pin holder that is made of a ceramic material.

For example, the lift pin of the present disclosure is made of sapphire. The conical tip of the lift pin has intricate features machined into it to precisely set the down position height of the lift pin. The lift pin up position height is determined by the lift ring. The up position height for each lift pin is further adjusted with thin sapphire shims. Each shim is retained by a metal or ceramic ring that acts as a weight to prevent the shim from exiting its mating hole in the lift ring. Ceramic rings can be thinner than metal rings and do not corrode, which prevents contamination issues. Closing off the lift pin hole using the conical tip of the lift pin prevents process gas flow to the backside of the wafer. Positioning the lift pin relative to the pedestal directly allows for a more repeatable lift pin position during deposition and all other wafer processing. These and other features of the lift pin design are explained below in detail.

The present disclosure is organized as follows. Initially, examples of substrate processing systems are shown and described with reference to FIGS. 1A and 1B. An example of a substrate support assembly including a lift pin and a lift pin holder assembly is shown and described with reference to FIG. 2. Examples of lift pin designs along with a lift pin holder assembly are shown and described with reference to FIGS. 3-9. A ball lock type lift pin holder assembly is shown and described with reference to FIGS. 10A and 10B. A fork lock type lift pin holder assembly is shown and described with reference to FIGS. 11A and 11B. A ring shaped platform (i.e., a lift ring) with slots in which the shims can be installed is shown and described with reference to FIG. 12. While only two examples of substrate processing systems are shown, the lift pin design described herein can be used with any other type of substrate processing system.

FIG. 1A shows a substrate processing system 10 including a processing chamber 12 that encloses other components of the substrate processing system 10 and contains RF plasma (if used). The substrate processing system 10 includes a showerhead 14 and a substrate support assembly 16. A substrate 18 is arranged on the substrate support assembly 16. The showerhead 14 introduces and distributes process gases during processing of the substrate 18.

If plasma is used, the plasma can be direct or remote plasma. In this example, an RF generating system 30 generates and outputs an RF voltage to either the showerhead 14 or the substrate support assembly 16 (the other is DC grounded, AC grounded, or floating). For example only, the RF generating system 30 may include an RF voltage generator 32 that generates the RF voltage that is fed by a matching network 34 to the showerhead 14 or the substrate support assembly 16. Alternately, the plasma may be delivered by a remote plasma source 36.

A gas delivery system 40 includes one or more gas sources 42-1, 42-2, . . . , and 42-N (collectively gas sources 42), where N is a positive integer. The gas sources 42 supply one or more etch gas mixtures, precursor gas mixtures, cleaning gas mixtures, ashing gas mixtures, etc. to the processing chamber 12. Vaporized precursor may also be used. The gas sources 42 are connected by valves 44-1, 44-2, . . . , and 44-N (collectively valves 44) and mass flow controllers 46-1, 46-2, . . . , and 46-N (collectively mass flow controllers 46) to a manifold 48. An output of the manifold 48 is fed to the processing chamber 12. For example only, the output of the manifold 48 is fed to the showerhead 14.

A heater 50 may be connected to a heater coil (not shown) arranged in the substrate support assembly 16. The heater 50 may be used to control a temperature of the substrate support assembly 16 and the substrate 18. A valve 60 and pump 62 may be used to evacuate reactants from the processing chamber 12. A controller 70 may be used to control components of the substrate processing system 10. For example only, the controller 70 may be used for controlling flow of process gases, monitoring process parameters such as temperature, pressure, power, etc., striking and extinguishing plasma, removing reactants, etc.

FIG. 1B shows another example of a substrate processing chamber 80 including an upper chamber 82 and a lower chamber 84 that includes the substrate support assembly 16. An inductive coil 86 is arranged around the upper chamber 82. The RF generating system 30 outputs RF power to the inductive coil 86 to create plasma 88 in the upper chamber 82. A showerhead 90 filters ions and delivers radicals to the lower chamber 84. The showerhead 90 may also be used to supply secondary gas such as precursor gas from a gas delivery system 40-2 to the lower chamber 84.

Figure 2:
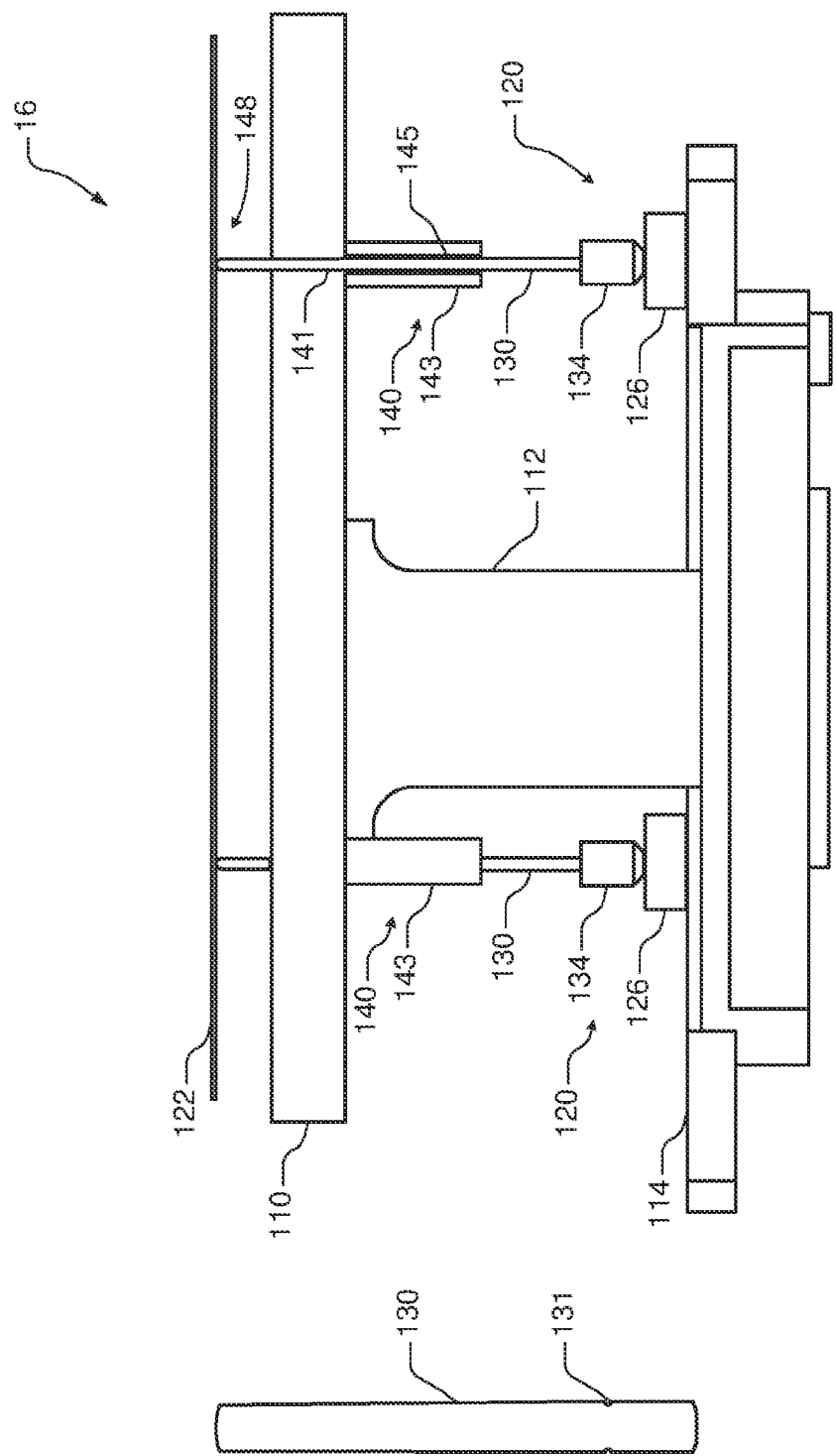
FIG. 2 shows an example of a substrate support assembly used in the substrate processing systems of FIGS. 1A and 1B.

FIG. 2 shows an example of the substrate support assembly 16 in further detail. The substrate support assembly 16 may be arranged in a processing chamber such as those shown in FIGS. 1A and 1B or any other substrate processing chamber. The substrate support assembly 16 includes a substrate supporting plate (also called a top plate) 110, a supporting column 112, and a base 114. The base 114 may include a ring shaped platform or structure (also called a lift ring, shown and described with reference to FIG. 12) in which the lift pins and lift pin holder assemblies of the present disclosure can be installed. In some examples, the supporting column 112 moves relative to the base 114.

Lift pin holder assemblies 120 (shown generically here and specifically later in FIGS. 10A-11B) are arranged below the substrate supporting plate 110 on the base 114. The lift pin holder assembly 120 includes a base portion 126, a lift pin 130, and a lift pin holder 134. In some examples, the lift pin holder assembly 120 and the lift pin 130 are generally cylindrically shaped. The lift pin 130 includes a circular groove 131, which is useful in locking the lift pin 130 into the lift pin holder assemblies described with reference to FIGS. 10A-11B below.

One or more guiding elements 140 may be used to help guide the lift pin 130. In some examples, the guiding elements 140 include a cylindrical support 143 that is attached to a bottom surface of the substrate supporting plate 110. The cylindrical support 143 includes a bore 145 for receiving a middle portion the lift pin 130. Likewise, the substrate supporting plate 110 includes a bore 141 (shown generically here and specifically later in FIGS. 3-8) for receiving an upper portion of the lift pin 130.

During use, the base 114 may be raised and lowered relative to the substrate supporting plate 110 (e.g., using the controller 70 and suitable actuators) to vary a height of the upper end of the lift pins 130 relative to an upper surface of the substrate supporting plate 110. As a result, the lift pins 130 lift the substrate 122 above the substrate supporting plate 110 or are positioned to receive the substrate 122 to be loaded onto the substrate supporting plate 110. Clearance is provided between the substrate 122 and the upper surface of the substrate supporting plate 110 as shown at 148.

A small gap exists between the substrate 122 and the upper surface of the substrate supporting plate 110 when the substrate 122 is arranged on the upper surface of the substrate supporting plate 110 for processing. Process gases can diffuse through the gap causing deposition on the backside of the substrate 122. Process gases can also flow through another small gap that exists between the bore 141 and the lift pin 130, which is shown in further detail in FIG. 3, causing deposition on the backside of the substrate 122.

In FIGS. 3-8, a ball lock type lift pin holder assembly 120 is shown and described for example only. Any other lift pin holder assembly such as a fork type lift pin holder assembly shown and described later with reference to FIGS. 11A and 11B may be used instead.

Figure 3:
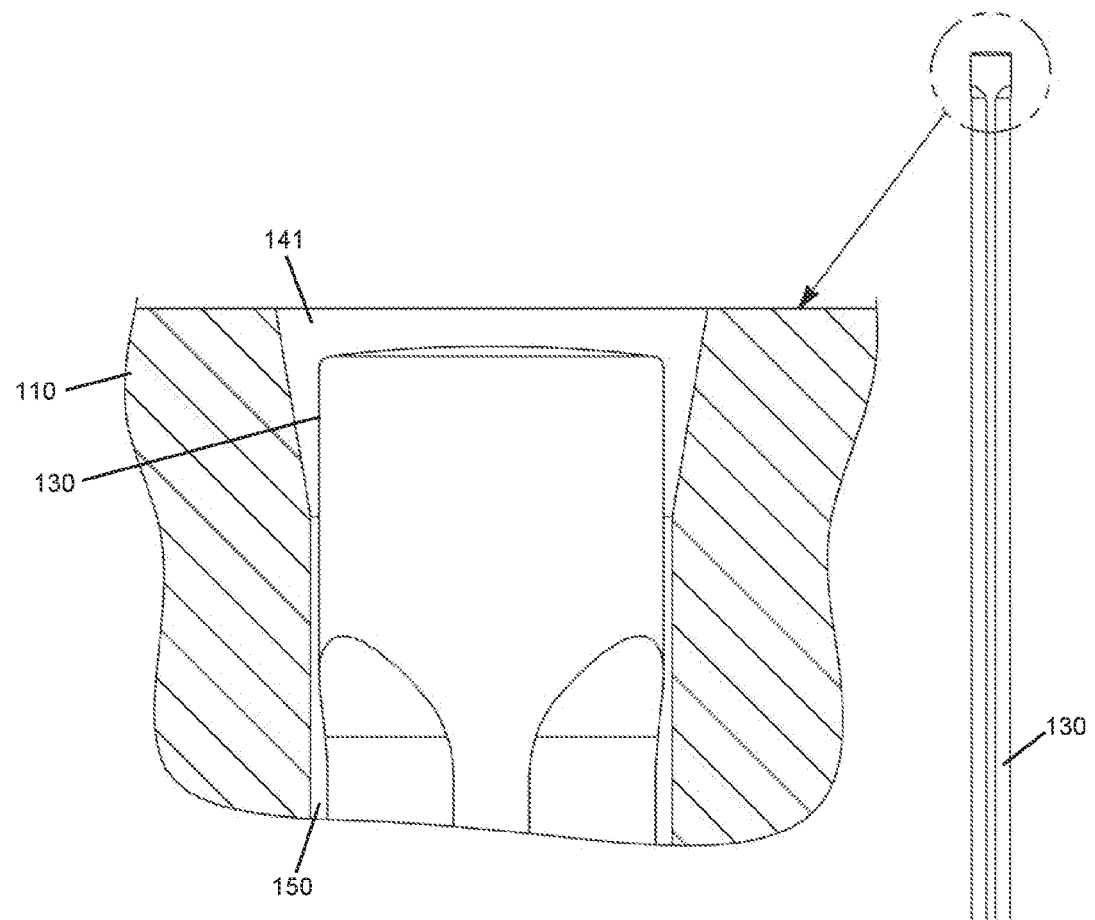
FIG. 3 shows a first example of a lift pin for use with the substrate support assembly of FIG. 2.

FIG. 3 shows the structures of the lift pin 130 and the bore 141 in further detail. The bore 141 can be cylindrical (as shown in FIG. 2) or conical (as shown in FIG. 3) in shape. Throughout the following description, the bore 141 is conical in shape and is called the conical bore 141. The conical bore 141 tapers downwardly like a funnel or the shape of the letter Y as shown. A small gap 150 exists between the lift pin 130 and the cylindrical portion of the conical bore 141 as shown. Process gases can flow through the gap 150 causing deposition on the backside of the substrate 122.

Further, the lift pin 130 and the lift pin holder assembly 120 rest on the lift ring in the base 114 of the substrate supporting plate 110 regardless of whether the lift pin 130 is in up position (to raise the substrate 122) or in down position (after placing the substrate on the top plate 110). Consequently, the height of the lift pin 130 when the lift pin 130 is in a down position (called the down height or down position height of the lift pin) varies due to factors such as the height of the lift ring and thermal expansion of the lift pin 130 and various components of the substrate support assembly 16.

The novel lift pin design according to the present disclosure described below with reference to FIGS. 4-8 solves the problem of backside deposition by closing off or blocking the flow of process gases to the backside of the substrate 122 and by increasing the repeatability of the height of the lift pin relative to the substrate support assembly 16 and the substrate 122. The lift pin design makes the height of the lift pin independent of the height of the lift ring and thermal expansion of various components of the substrate support assembly 16.

Figure 4:
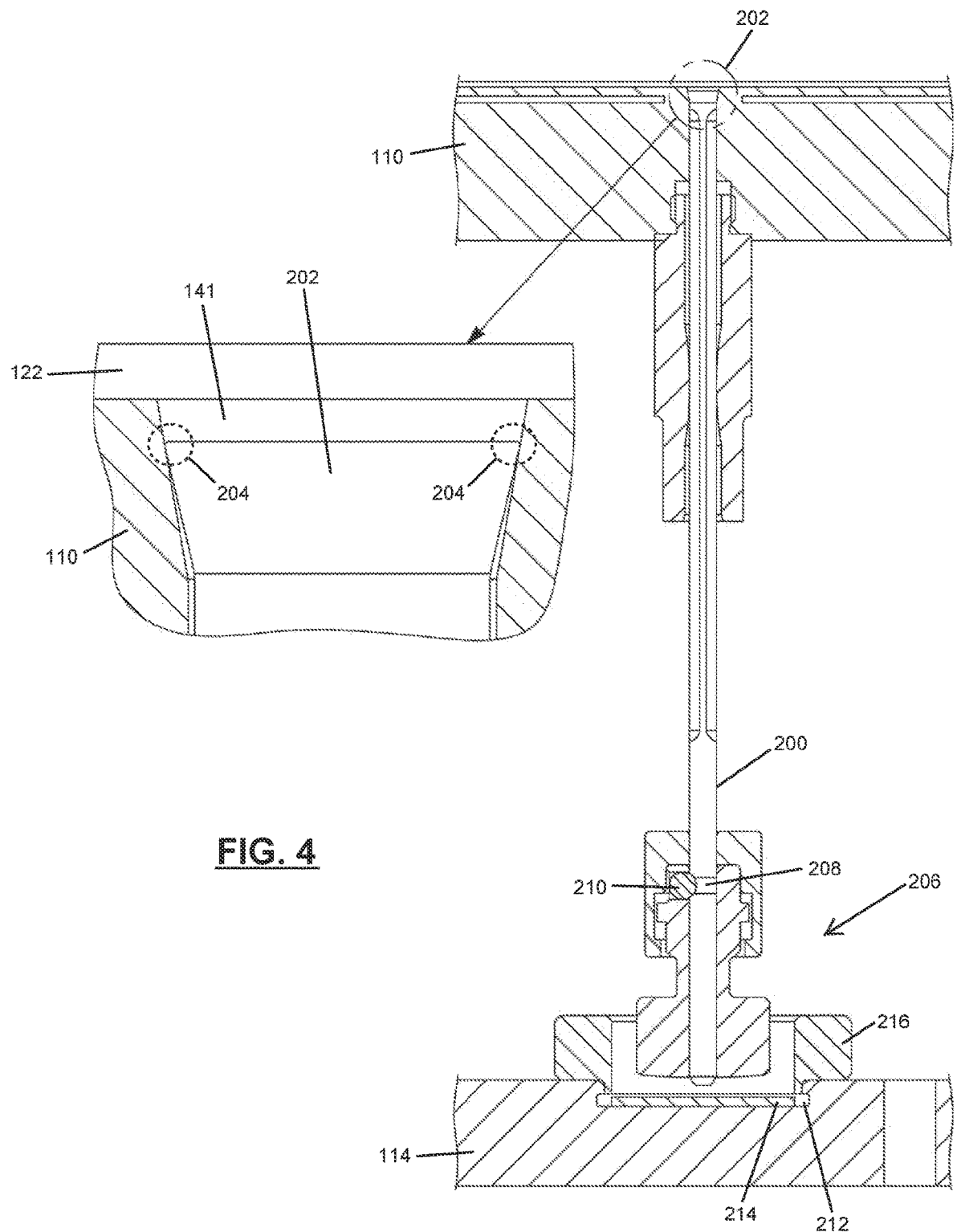
FIG. 4 shows a second example of a lift pin for use with the substrate support assembly of FIG. 2.

FIG. 4 shows the design of a lift pin 200 according to the present disclosure. Specifically, the lift pin 200 has a conical or tapered tip 202. The conical tip 202 (also called a top end or top portion) of the lift pin 200 engages with the conical bore 141 of the top plate 110 of the substrate support assembly 16. This engagement of the conical tip 202 with the conical bore 141 closes off or blocks the lift pin hole in the top plate 110 to process gas flow as shown at 204.

This engagement of the conical tip 202 with the conical bore 141 also defines a gap or distance between the top surface of the conical tip 202 and the top surface of the top plate 110 (or the bottom of the substrate 122). When the lift pin 200 is in down position, the lift pin 200 hangs from the conical bore 141 (at points 204), thus defining a gap or distance between the top surface of the conical tip 202 and the top surface of the top plate 110 (or the bottom of the substrate 122).

The bottom end of the lift pin 200 is cylindrical and is inserted into a lift pin holder assembly 206. For example only, a ball lock type lift pin holder assembly is shown. Any other lift pin holder assembly such as a fork type lift pin holder assembly shown and described with reference to FIGS. 11A and 11B may be used instead. The bottom cylindrical portion of the lift pin includes a circular groove 208. The lift pin holder assembly 206 in the example shown includes a ball lock 210 that engages with the circular groove 208 to hold the lift pin 200 securely in the lift pin holder assembly 206.

The lift ring in the base 114 of the substrate support assembly 16 (shown and described with reference to FIG. 12) includes a plurality of slots 212. The number of slots is equal to the number of lift pins 200 (e.g., at least 3). A thin shim 214 is arranged in each slot 212. When the lift ring raises the substrate 122 using the lift pins 200, the lift pin holder assembly 206 rests on the corresponding shim 214.

The thickness of each shim 214 is selected to compensate for manufacturing tolerances associated with the lift pins 200, the lift pin holder assemblies 206, the slots 212 in the lift ring, and the lift ring itself. In other words, to hold the substrate 122 parallel to the top plate 110 when the substrate 122 is raised (or lowered) using the lift pins 200, the lift pins 200 need to be of equal height. The shims 214 of appropriate thickness are used to fine tune the height of each lift pin 200 in up position so that the substrate 122 is held parallel to the top plate 110 when raised (or lowered) by the lift pins 200. For example, the lift pins 200 and the shims 214 can be made of sapphire.

A retainer 216 is arranged on the periphery of and around each shim 214. The retainer 216 is annular in shape. The retainer 216 surrounds the lift pin holder assembly 206 when the lift pin holder assembly 206 rests on the corresponding shim 214 while raising the substrate 122. The retainer 216 can be made of a metal (e.g., aluminum) or preferably of a ceramic material. Some ceramic material can have greater specific gravity than a metal such as aluminum. Accordingly, using a ceramic material can help reduce the thickness or height of the retainer 216 while still having sufficient weight.

When in down position, the lift pin 200 hangs from the conical bore 141 by the weight of the lift pin holder assembly 206, which is made of a ceramic material. The lift pin holder assembly 206 hangs above the lift ring. That is, the lift pin holder assembly 206 does not contact the lift ring and does not rest on the shim 214 when the lift pin 200 is in down position (e.g., after the substrate is placed on the top plate 110). During the time the lift pin 200 hangs from the conical bore 141, the weight of the retainer 216, which is made of a metal (e.g., aluminum) or ceramic material, holds the shim 214 securely in the slot 212. That is, the weight of the retainer 216 prevents the shim 214 from moving or slipping from the slot 212.

Since the lift pin 200 hangs from the conical bore 141 in down position and the lift pin 200 does not contact the lift ring, the down height of the lift pin 200 does not vary due to factors including manufacturing tolerances and thermal expansion of various components. Thus, positioning the lift pin 200 directly relative to the substrate support assembly 16 (i.e., relative to the top plate 110 of the substrate support assembly 16 instead of relative to the lift ring) provides a more repeatable lift pin position and height during deposition and other wafer processing.

Figure 5:
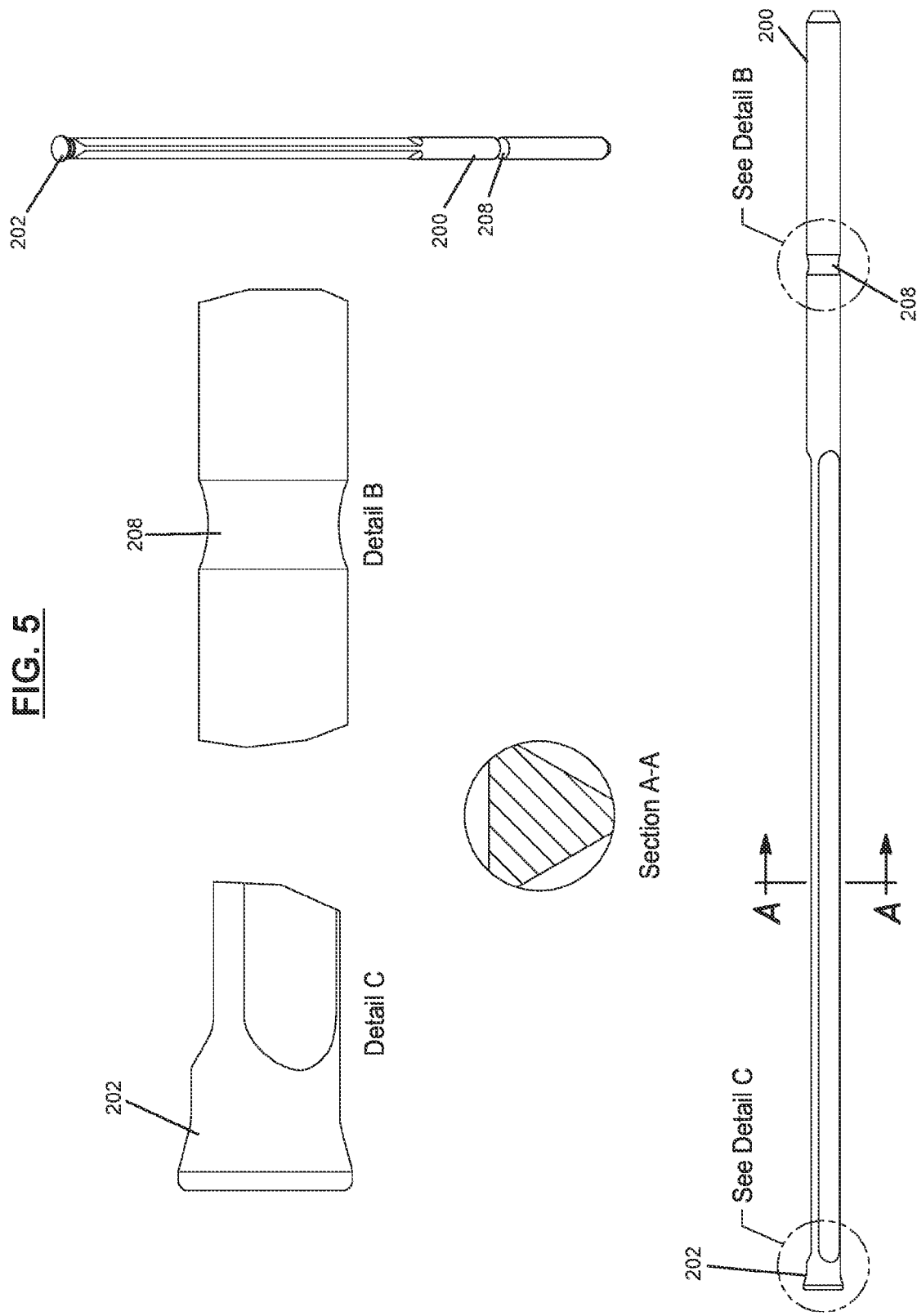
FIG. 5 shows the second example of the lift pin in further detail.

FIG. 5 shows examples of different views of the lift pin 200. Features of the lift pin 200 are shown in detail. For example, different views of the conical tip 202 of the lift pin 200 are shown. The circular groove 208 of the lift pin 200 is shown in detail.

Figure 6:
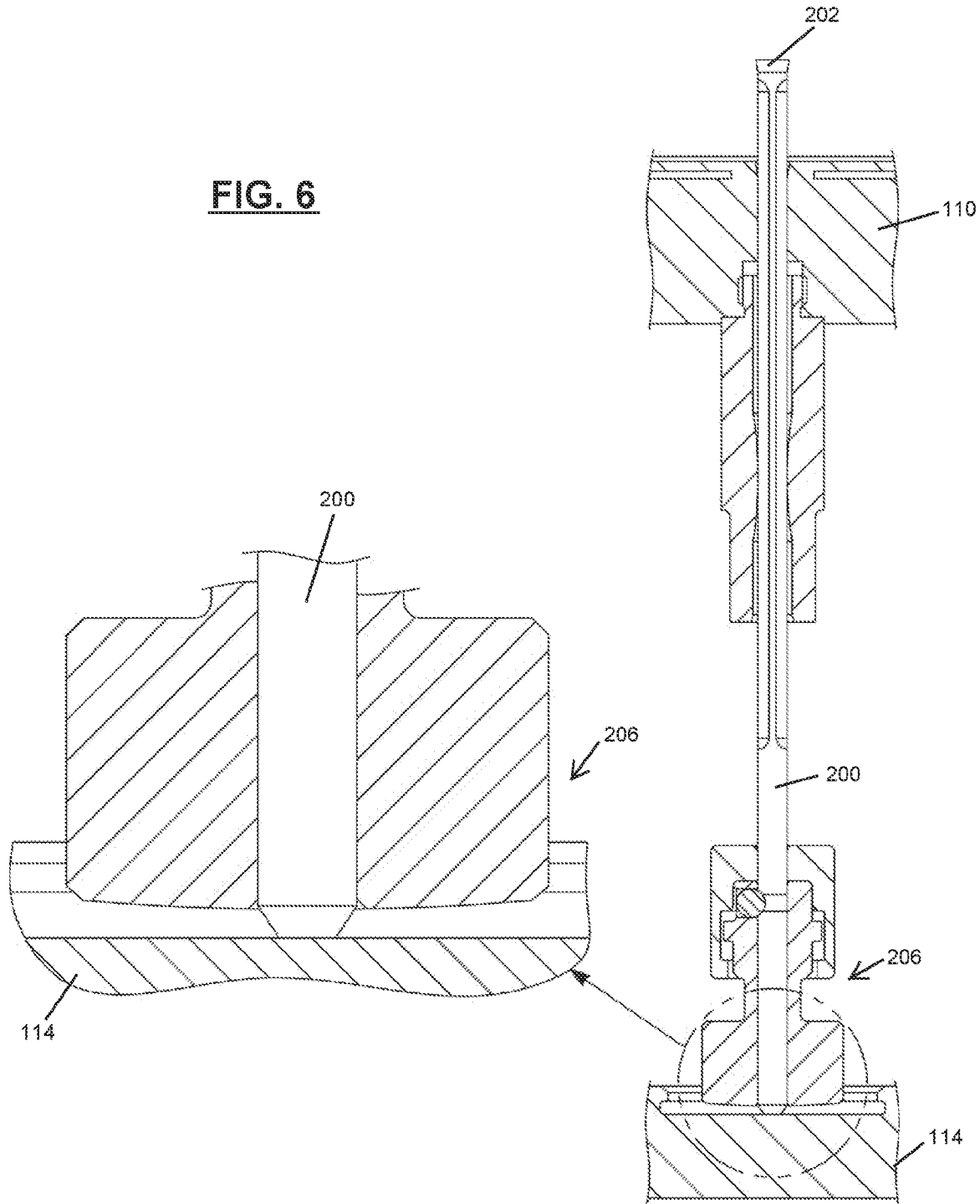
FIG. 6 shows the second lift pin in an up position.

FIG. 6 shows the lift pin 200 in up or raised position (i.e., with the substrate 122 raised from the top plate 110 of the substrate support assembly 16). In up or raised position, the lift pin holder assembly 206 hangs from the lift pin 200, which rests on the base 114 of the substrate support assembly 16 (more particularly on the shim 214 in the slot 212 of the lift ring). To illustrate the contact between the lift pin holder assembly 206 and the base 114, other elements such as the slot 212, the shim 214, and the retainer 216, which are already shown and described with reference to FIG. 4, are omitted.

Figure 7:
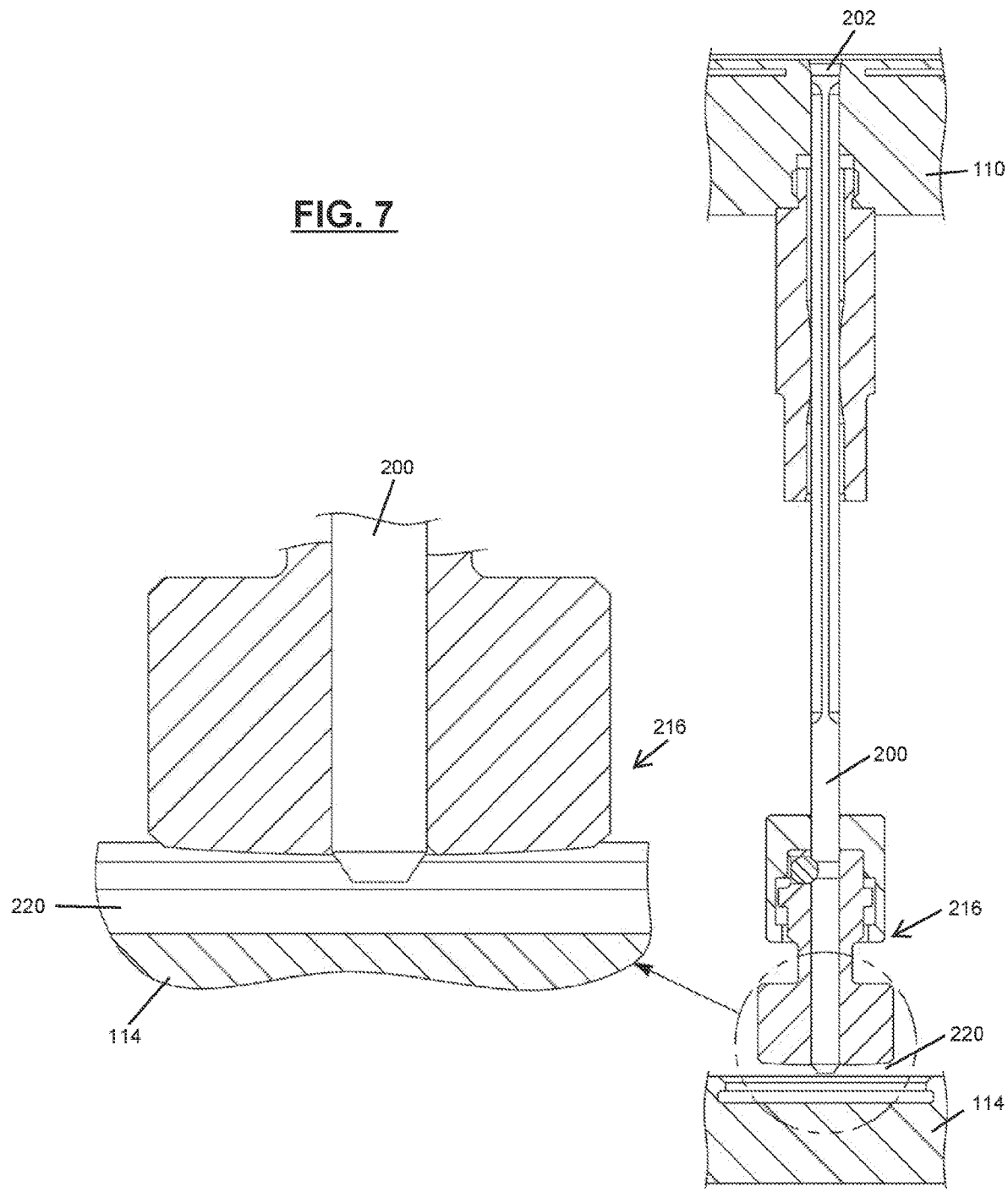
FIG. 7 shows the second lift pin in a down position.

FIG. 7 shows the lift pin 200 in down position (i.e., after placing the substrate 122 on the top plate 110 of the substrate support assembly 16). In down position, the lift pin holder assembly 206 hangs from the lift pin 200, which does not contact or rest on the base 114 of the substrate support assembly 16. Instead, the lift pin 200 hangs from the conical bore 141 (as shown in FIG. 4), and the lift pin holder assembly 206 hangs above the base 114. Consequently, a gap or distance 220 exists between the lift pin holder assembly 206 and the base 114. To illustrate the separation (i.e., the gap 220) between the lift pin holder assembly 206 and the base 114, other details such as the slot 212, the shim 214, and the retainer 216, which are already shown and described with reference to FIG. 4, are omitted.

Figure 8:
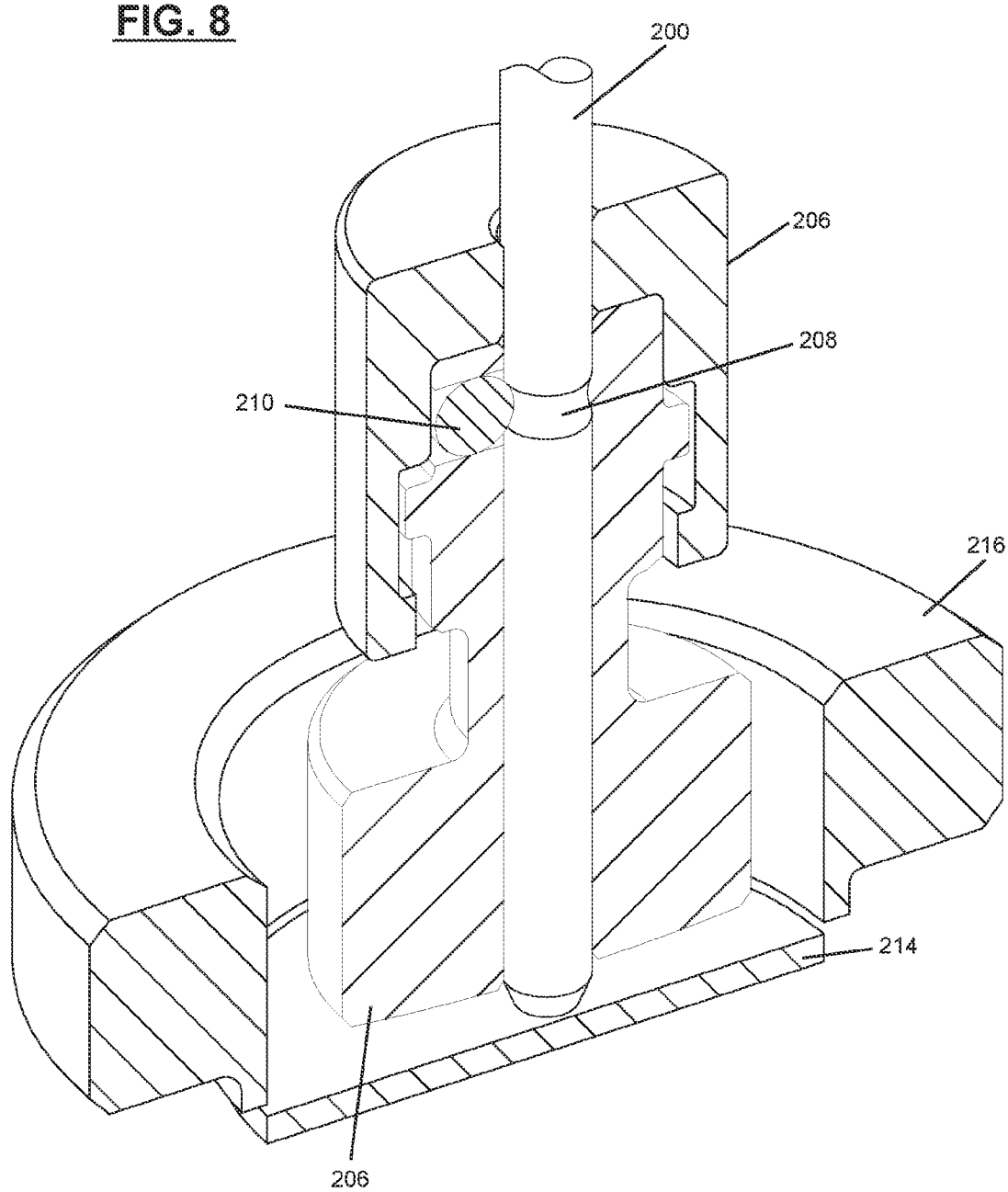
FIG. 8 shows a cross-sectional view of the second lift pin, a lift pin holder assembly, a shim, and a shim retainer.

FIG. 8 shows a cross-sectional view of the lift pin holder assembly 206 with the lift pin 200 inserted into the lift pin holder assembly 206. In this view, the lift pin 200 and the lift pin holder assembly 206 are resting (i.e., arranged) on the shim 214 (i.e., the lift pin 200 is in up position), and the retainer 216 is surrounding a base portion of the lift pin holder assembly 206.

FIG. 9 shows the shim retainer 216 in further detail. As explained above, each shim 214 used with corresponding lift pin 200 and lift pin holder assembly 206 can have a different thickness to fine tune the height of the lift pin 200 by accounting for manufacturing tolerances in the lift pins 200, the slots 212, and the lift ring.

Figure 10B:
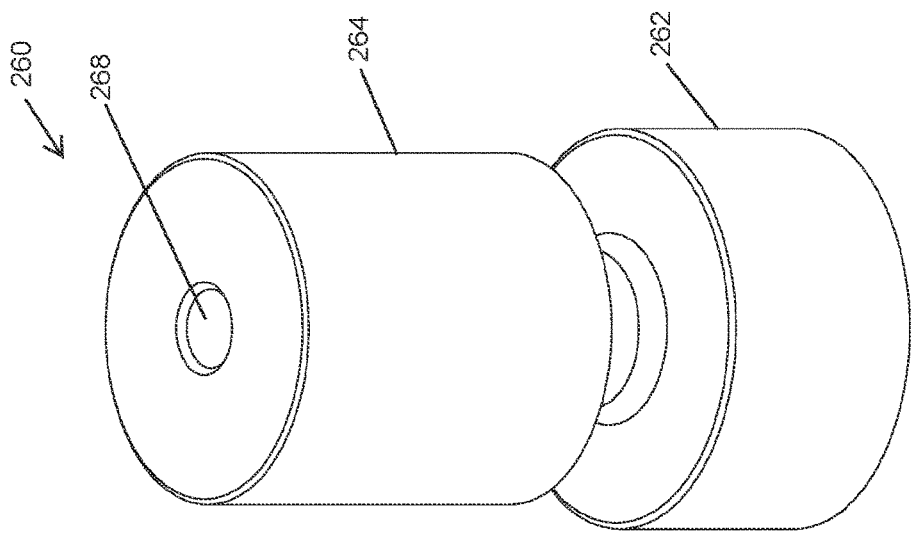
FIGS. 10A and 10B show a ball lock type lift pin holder assembly for use with the substrate support assembly of FIG. 2.
Figure 10A:
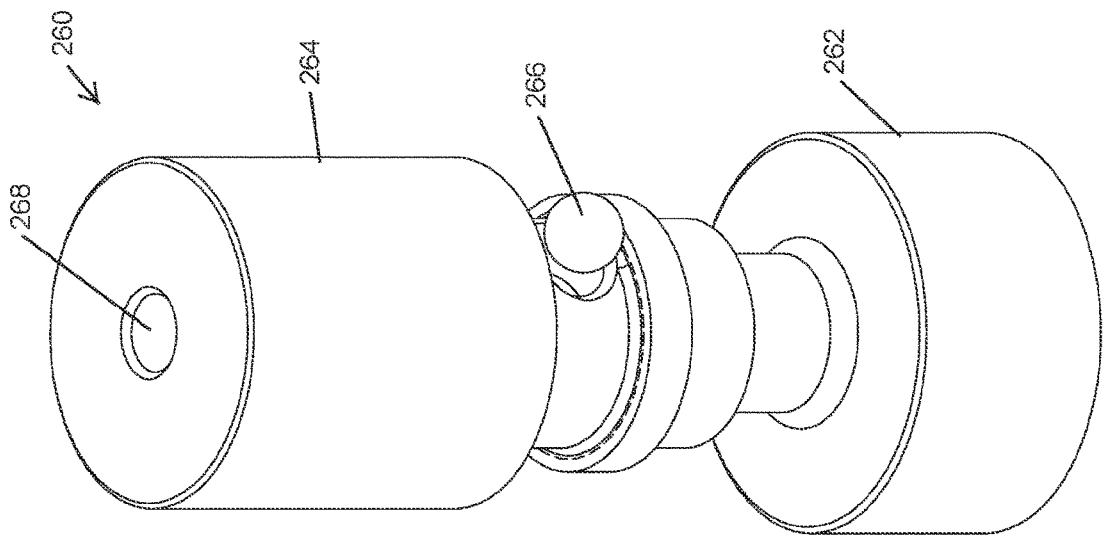
Figure 12:
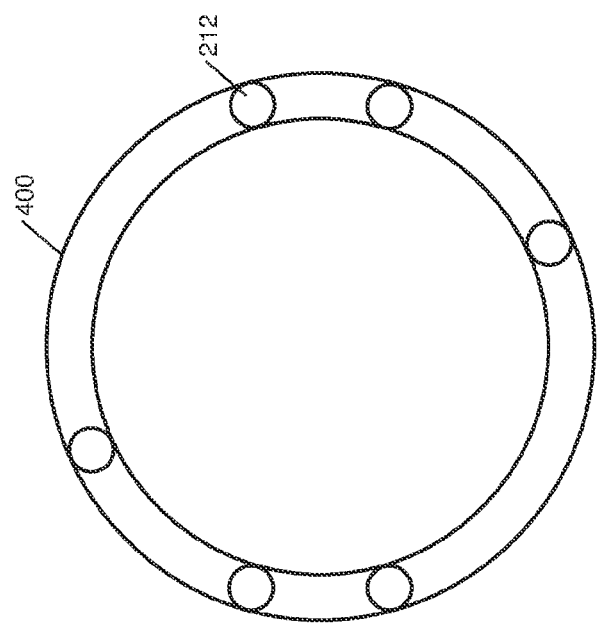
FIG. 12 schematically shows a slotted lift ring for use with the substrate support assembly of FIG. 2.

FIGS. 10A-12 show various examples and components of the lift pin holder assembly 206 in detail. FIGS. 10A and 10B show a ball lock type lift pin holder assembly (hereinafter ball lock holder assembly), which is used in the examples shown in FIGS. 4-8. FIGS. 11A and 11B show a fork lock type lift pin holder assembly (hereinafter fork lock holder assembly), which can be used instead of the ball lock holder assembly shown in FIGS. 4-8. FIG. 12 shows a ring shaped platform (also called a lift ring) with slots 212 in which the shims 214 can be installed. All of the structures, assemblies, and components shown in FIGS. 10A-12 are made of non-metallic material. For example, all of the structures, assemblies, and components shown in FIGS. 10A-12 are made of a ceramic material. Further, the lift pin 200 is also made of a non-metallic material (e.g., sapphire).

FIGS. 10A and 10B show a ball lock holder assembly 260. The ball lock holder assembly 260 comprises a base portion 262 and a top portion (also called a cap) 264. The base portion 262 includes a ball lock 266 to lock the lift pin 200 when the lift pin 200 is inserted into the base portion 262. The top portion 264 is installed on the base portion 262 by sliding down the top portion 264 over the ball lock 266. When the top portion 264 slides over the ball lock 266, the top portion 264 locks into the base portion 262 via a ring shaped element (not shown) that radially protrudes from a stem of the base portion 262 and that mates with a corresponding element in the top portion 264 (not shown).

FIG. 10A shows the ball lock holder assembly 260 with the top portion 264 not fully installed onto (i.e., not locked into) the base portion 262. FIG. 10B shows the ball lock holder assembly 260 with the top portion 264 fully installed onto (i.e., locked into) the base portion 262. With the top portion 264 fully installed onto (i.e., locked into) the base portion 262, the lift pin 200 can be inserted into the ball lock holder assembly 260 through an opening 268 in the top portion 264. After the lift pin 200 is inserted through the opening 268 down towards the base portion 262, the lift pin 200 is locked into the ball lock holder assembly 260 by slightly pushing down on the top portion 264. The circular groove 208 around the lift pin 200 (shown in FIG. 4) slides over the ball lock 266 (element 210 in FIG. 4) and locks into the ball lock 266. To unlock and release the lift pin 200 from the ball lock holder assembly 260, the top portion 264 is slightly pulled up, and the lift pin 200 is removed from the ball lock holder assembly 260. The circular groove 208 around the lift pin 200 is unlocked and released from the ball lock 266.

FIGS. 11A and 11B show a fork lock holder assembly 300. The fork lock holder assembly 300 comprises a base portion 302 and a top portion (also called a cap) 304. Before installing the top portion 304 on the base portion 302, the lift pin 200 is inserted through an opening 306 at the center of the top portion 304. The top portion 304 is installed on the base portion 302 by sliding down the top portion 304 along with the lift pin 200 into the base portion 302. The top portion 304 is then slid down on the lift pin 200 towards the base portion 302. The lift pin 200 gets locked into the base portion 302 as explained below and remains locked into the base portion 302.

After the top portion 304 is installed on the base portion 302, the fork lock holder assembly 300 looks externally similar to the ball lock holder assembly 260 shown in FIG. 10B. Therefore, a drawing of the fork lock holder assembly 300 with the top portion 304 installed on the base portion 302 is not shown again for brevity. To remove the lift pin 200 from the fork lock holder assembly 300, the top portion 304 is pulled up and away from the base portion 302. When the top portion 304 is pulled up and away from the base portion 302, the lift pin 200 gets unlocked from the base portion 302 (i.e., from the fork lock holder assembly 300) and can be removed from the base portion 302.

FIG. 11A shows the base portion 302 of the fork lock holder assembly 300 in further detail. FIG. 11A shows various views of the base portion 302. The base portion 302 comprises a cylindrical portion 310 that defines a lower portion (or base) of the base portion 302. The base portion 302 comprises a slot 312 for receiving the lift pin 130. The slot 312 extends perpendicularly from the cylindrical portion 310. The slot 312 is generally a C-shaped structure that defines a cavity 314 in which the lift pin 200 is received and retained. The slot 312 is generally a hollow, circular or oval shaped, tubular structure with a portion of the tubular structure sliced and removed along the length (i.e., the height) of the slot 312 to make the slot 312 a C-shaped structure. The cavity 314 extends through the slot 312 into the cylindrical portion 310.

Detail B in FIG. 11A shows the design of the slot 312 that enables the lift pin 200 to be inserted and retained in the base portion 302 (i.e., in the fork lock holder assembly 300). The slot 312 has a series of radii so that the lift pin 200 can be inserted off-center from a centerline of the base portion 302 and then slid into the centerline. At a distal end (i.e., the end opposite from the cylindrical portion 310), the slot 312 includes a smaller (inner) radius or an inner radial portion that locks against the circular groove 208 around the lift pin 200 (shown in FIG. 4). The inner radius or the inner radial portion of the slot 312 near the top end of the slot 312 engages with the circular groove 208 on the lift pin 200 and locks the lift pin 200 into the slot 312 and in the base portion 302. A sliding surface of the slot 312 has a radius matching the insert portion of the slot 312 and is chamfered both above and below to guide the lift pin 200 to lock against the base portion 302. The outer radius of the slot 312 matches the inner radius of the top portion 304 so that the top portion 304 slides down the slot 312 and retains the lift pin 200 within the cavity 314 in the slot 312.

FIG. 11B shows the top portion 304 of the fork lock holder assembly 300 in further detail. The top portion 304 is cylindrical in shape and comprises a hollow structure that mates with the slot 312 of the base portion 302. The top portion 304 comprises the opening 306. The diameter of the opening 306 matches the diameter of the lift pin 200. The top portion 304 comprises a first cylindrical hollow portion 330 that has the diameter of the opening 306 and that extends from the opening 306 along the center of the top portion 304. The top portion 304 further comprises a second cylindrical hollow portion 332 that extends from a distance from the opening 306 along the center of the top portion 304. The second cylindrical hollow portion 332 mates with and surrounds the slot 312 of the base portion 302 when the top portion 304 is installed on the base portion 302. The opening 306 aligns with a portion of the cavity 314 near the top of the slot 312 when the top portion 304 is installed on the base portion 302.

FIG. 12 schematically shows a slotted annular structure (also called a lift ring) 400 that can be comprised in the base 114 of the substrate support assembly 16 shown in FIG. 2. The lift ring 400 has an inner diameter and an outer diameter. The lift ring 400 comprises a plurality of slots 212. The slots 212 are designed to hold the shims 214 shown in FIGS. 4-8. The slots 212 are shown as being circular in shape for illustrative purposes only. Practically, the slots 212 may be almost circular near the outer edge of the lift ring 400 to allow for sliding the shims 214 in and out of the slots 212. Alternatively, the slots can be perfectly circular as shown, and the shims 214 can be inserted into the slots 212 and can be held in the slots 212 by the retainers 216.

The number of slots 212 is equal to the number of lift pins 200 used with the substrate support assembly 16. For each slot 212, a portion of the lift ring 400 is removed (carved or dug out) from the lift ring 400 to form the slot 212 having a uniform depth. For example, the slots 212 can be formed by machining or etching a near-circular portion from the top surface of the lift ring 400. The depth of each slot 212 is less than the thickness of the lift ring 400 and is sufficient to install the shim 214 into the slot 212. The top of each slot 212 is flush with the top surface of the lift ring 400. The slots 212 are coplanar with the lift ring 400.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An apparatus comprising:
    a lift pin to raise and lower a semiconductor substrate relative to a substrate support assembly in a processing chamber, wherein the lift pin comprises:
        a top end having a conical shape tapering downwardly; and
        a bottom end having a cylindrical shape;
    a lift pin holder to hold the bottom end of the lift pin;
    a top plate of the substrate support assembly comprising a conical bore tapering downwardly; and
    a ring-shaped structure arranged at a base of the substrate support assembly to support the lift pin holder and to raise and lower the semiconductor substrate relative to the top plate,
    wherein the top end of the lift pin suspends from the conical bore by a weight of the lift pin holder when the lift pin is in a down position; and
    wherein the lift pin holder suspends above and without contacting the ring-shaped structure when the lift pin is in the down position.

2. The apparatus of claim 1 further comprising:
    a shim arranged in a slot in the ring-shaped structure wherein the lift pin holder rests on the shim when the ring-shaped structure raises the lift pin to raise the semiconductor substrate from the top plate; and
    a retainer arranged on the shim that surrounds the lift pin holder when the lift pin holder rests on the shim.

3. The apparatus of claim 1 wherein in the down position, the top end of the lift pin suspends from the conical bore at a predetermined distance from a top surface of the top plate of the substrate support assembly.

4. The apparatus of claim 1 further comprising a shim arranged in a slot in the ring-shaped structure wherein the lift pin holder rests on the shim when the ring-shaped structure raises the lift pin to raise the semiconductor substrate from the top plate.

5. The apparatus of claim 4 further comprising an annular retainer arranged on the shim.

6. The apparatus of claim 5 wherein the annular retainer surrounds a base portion of the lift pin holder when the lift pin holder rests on the shim.

7. The apparatus of claim 1 wherein the lift pin further comprises a groove proximate to the bottom end and wherein the lift pin holder comprises a ball lock to lock into the groove.

8. The apparatus of claim 2 wherein the lift pin, the lift pin holder, the shim, and the retainer are made of a ceramic material.

9. The apparatus of claim 2 wherein the lift pin, the lift pin holder, the shim, and the retainer are made of a ceramic material having a specific gravity greater than a metal including aluminum.

10. A system comprising:
    a plurality of lift pins to raise and lower a semiconductor substrate relative to a substrate support assembly in a processing chamber, wherein each of the lift pins comprises:
        a top end having a conical shape tapering downwardly; and
        a bottom end having a cylindrical shape; and
    a plurality of lift pin holders, each of the lift pin holders to hold the bottom end of a respective one of the lift pins;
    a top plate of the substrate support assembly comprising a plurality of conical bores tapering downwardly, wherein the top ends of the lift pins suspend from the conical bores when the lift pins are in a down position; and
    a ring-shaped structure arranged at a base of the substrate support assembly to support the lift pin holders and to raise and lower the semiconductor substrate relative to the top plate, wherein the lift pin holders suspend above the ring-shaped structure when the lift pins are in the down position.

11. The system of claim 10 further comprising:
    a plurality of shims respectively arranged in a plurality of slots in the ring-shaped structure,
    wherein the lift pin holders rest on respective of the shims when the ring-shaped structure raises the lift pins to raise the semiconductor substrate from the top plate, and
    wherein the raised semiconductor substrate is parallel to the top plate.

12. The system of claim 11 further comprising:
    a plurality of retainers arranged on respective ones of the shims,
    wherein the retainers surround respective ones of the lift pin holders when the lift pin holders rest on the shims.

13. The system of claim 12 wherein the lift pins, the lift pin holders, the shims, and the retainers are made of a ceramic material.

14. A lift pin assembly comprising:

a lift pin to raise and lower a semiconductor substrate relative to a substrate support assembly in a processing chamber, wherein the lift pin comprises:
  a top end having a conical shape tapering downwardly;
  a bottom end having a cylindrical shape; and
  a groove proximate to the bottom end; and
a lift pin holder to hold the bottom end of the lift pin, wherein the lift pin holder comprises a ball lock to lock into the groove, and wherein the ball lock comprises a single ball.

15. A system comprising the lift pin assembly of claim 14 and the substrate support assembly wherein the substrate support assembly comprises a top plate having a conical bore tapering downwardly and wherein the lift pin suspends from the conical bore at a predetermined distance from a top surface of the top plate with the conical bore supporting the top end of the lift pin when the lift pin is in a down position.

16. A system comprising the lift pin assembly of claim 14, the system further comprising:
  a top plate of the substrate support assembly comprising a conical bore tapering downwardly wherein the top end of the lift pin suspends from the conical bore when the lift pin is in a down position; and
  a ring-shaped structure arranged at a base of the substrate support assembly to support the lift pin holder and to raise and lower the semiconductor substrate relative to the top plate, wherein the lift pin holder suspends above the ring shaped ring-shaped structure when the lift pin is in the down position.

17. The system of claim 16 further comprising:
  a shim arranged in a slot in the ring-shaped structure wherein the lift pin holder rests on the shim when the ring-shaped structure raises the lift pin to raise the semiconductor substrate from the top plate; and
  a retainer arranged on the shim that surrounds the lift pin holder when the lift pin holder rests on the shim.

18. The system of claim 17 wherein the lift pin, the lift pin holder, the shim, and the retainer are made of a ceramic material.

* * * * *